United States Patent
Lopez et al.

(10) Patent No.: US 7,394,271 B2
(45) Date of Patent: Jul. 1, 2008

(54) TEMPERATURE SENSING AND PREDICTION IN IC SOCKETS

(75) Inventors: Christopher A. Lopez, Phoenix, AZ (US); Brian J. Denheyer, Portland, OR (US)

(73) Assignee: Wells-CTI, LLC, Vancouver, WA (US)

( * ) Notice: Subject to any disclaimer, the term of this patent is extended or adjusted under 35 U.S.C. 154(b) by 0 days.

(21) Appl. No.: 11/368,283

(22) Filed: Mar. 3, 2006

(65) Prior Publication Data

US 2006/0164111 A1      Jul. 27, 2006

Related U.S. Application Data

(63) Continuation-in-part of application No. 11/069,589, filed on Feb. 28, 2005, now Pat. No. 7,042,240, and a continuation-in-part of application No. 10/920,531, filed on Aug. 17, 2004, now Pat. No. 7,123,037.

(60) Provisional application No. 60/659,808, filed on Mar. 8, 2005, provisional application No. 60/548,303, filed on Feb. 27, 2004.

(51) Int. Cl.
*G01R 31/02* (2006.01)
*H05B 1/00* (2006.01)
*G01K 1/00* (2006.01)
*G06F 1/26* (2006.01)
*G06F 1/00* (2006.01)

(52) U.S. Cl. .............. 324/760; 219/209; 702/130; 713/321; 713/322

(58) Field of Classification Search ............... 324/760
See application file for complete search history.

(56) References Cited

U.S. PATENT DOCUMENTS

| | | | | |
|---|---|---|---|---|
| 5,911,897 A | * | 6/1999 | Hamilton ................... 219/497 |
| 6,084,215 A | * | 7/2000 | Furuya et al. ............ 219/444.1 |
| 6,104,204 A | * | 8/2000 | Hayama et al. ............ 324/760 |
| 6,215,324 B1 | * | 4/2001 | Yoshida ..................... 324/760 |
| 6,476,627 B1 | * | 11/2002 | Pelissier et al. ............ 324/760 |
| 6,537,481 B2 | * | 3/2003 | Brennan .................... 264/406 |
| 6,577,146 B2 | | 6/2003 | Gamache et al. |
| 6,668,570 B2 | * | 12/2003 | Wall et al. ..................... 62/223 |
| 6,886,976 B2 | * | 5/2005 | Gaasch et al. .................. 374/5 |
| 7,023,229 B2 | * | 4/2006 | Maesaki et al. ............ 324/760 |

* cited by examiner

*Primary Examiner*—Ha Tran Nguyen
*Assistant Examiner*—Roberto Velez
(74) *Attorney, Agent, or Firm*—Marger Johnson & McCollom, P.C.

(57) ABSTRACT

An apparatus and method are provided which preferably combines temperature sensing and prediction for more accurate temperature control of integrated circuits. An IC temperature sensing and prediction device includes a current sensing device that measures current passing through an IC, and a temperature control apparatus that measures a surface temperature of the IC. The device further includes an electronic controller that calculates the power consumed by the IC according to the measured current and adjusts the temperature of a heater or cooler responsive to the measured surface temperature and power consumption.

31 Claims, 3 Drawing Sheets

TEMPERATURE SENSING AND PREDICTION IN IC SOCKETS

RELATED APPLICATION DATA

This application claims the benefit of U.S. Ser. No. 60/659,808, filed on Mar. 8, 2005, the contents of which are herein incorporated by reference in their entirety. This application is a continuation-in-part of U.S. Ser. No. 11/069,589, entitled "Burn-In Testing Apparatus and Method," filed on Feb. 28, 2005, now U.S. Pat. No. 7,042,240, which claims the benefit of U.S. Ser. No. 60/548,303, filed on Feb. 27, 2004, and is a continuation-in-part of U.S. Ser. No. 10/920,531, entitled "Integrated Circuit Temperature Sensing Device and Method," filed on Aug. 17, 2004, now U.S. Pat. No. 7,123,037, which are commonly assigned and are herein incorporated by reference in their entirety.

TECHNICAL FIELD

This invention relates to integrated circuits and, more particularly, to temperature sensing and prediction for more accurate temperature control of integrated circuits.

BACKGROUND OF THE INVENTION

Integrated circuit (IC) packages must be tested after their manufacture, normally at elevated temperatures, which is typically a burn-in process. During that process, it is often necessary to control the temperature of ICs, sensors, and other elements. Techniques for doing so have been widely practiced for many years. The system normally consists of a heater (or cooler), a temperature sensor, and a comparator which applies energy to a heater in proportion to the difference in voltage measured on the temperature sensor as compared to a reference voltage. The energy is applied in the proper direction to cause the difference voltage to be reduced. Temperature control modules and temperature sensors of many types are widely sold for these purposes. A typical application is the control of the temperature of ICs for a burn-in process because of the temperature sensitivity of the ICs.

To achieve more accurate testing results, it is desirable to control the temperature of each individual IC being tested. Within a testing oven without individual temperature control, the actual temperature of each IC can vary due to different rates of convection, heat dissipation, or radiation within the oven. Individual temperature control can be achieved by sensing the temperature of each IC and varying the heat directed to each IC through the use of individual heaters.

Two such examples of sensing and heating individual ICs can be found in U.S. Pat. No. 5,164,661 to Jones and U.S. Pat. No. 5,911,897 to Hamilton. Both Jones and Hamilton disclose a testing socket with a sensor in direct contact with an IC that senses the case temperature of the IC.

As shown in FIG. 10, in Hamilton, a temperature sensor 110 is positioned within an insulated sensor housing 112 such that the sensor 110 protrudes from the housing 112 to contact the outer casing of the integrated circuit being tested. Hamilton discloses measuring the surface temperature (the case temperature) of the IC under test and does not disclose any apparatus or method for determining the temperature of the center of the IC (the junction temperature).

Jones discloses determining the junction temperature of the IC under test by calculating that junction temperature from the sensed case temperature and a predetermined thermal profile of the IC. The determination of the junction temperature of the IC is subject to time delays caused by the thermal time constants of the materials between the temperature sensor on the case surface of the IC and the junction of the IC.

Thus, it would be advantageous to have a system and method for more quickly determining the junction temperature of an IC under test.

SUMMARY OF THE INVENTION

One aspect of the invention is a method for controlling the temperature of an integrated circuit (IC). The method includes sensing a surface temperature of the IC, predicting a junction temperature, and adjusting the surface temperature based on the predicted junction temperature. Preferably, predicting the junction temperature includes measuring a power consumption of the IC and calculating a temperature adjustment value to the measured surface temperature based on the power consumption and thermal profile of the IC.

Another aspect of the invention is an IC temperature sensing and prediction device. The device includes a sensing device to measure current through an IC and a temperature control apparatus to change a surface temperature of the IC. The device also includes an electronic controller that receives a first signal from the sensing device representing the measured current through the IC and a second signal from the temperature control apparatus representing the surface temperature of the IC. Preferably, the temperature control apparatus includes a temperature sensor to thermally contact the IC and measure the surface temperature and a heater or cooler to directly contact the IC.

BRIEF DESCRIPTION OF THE DRAWINGS

The above and other features and advantages of embodiments of the invention will become readily apparent by reference to the following detailed description when considered in conjunction with the accompanying drawings.

DETAILED DESCRIPTION

As will be apparent to those skilled in the art from the following disclosure, the invention as described herein may be embodied in many different forms and should not be construed as limited to the specific embodiments set forth herein. Rather, these embodiments are provided so that this disclosure will fully convey the principles of the invention to those skilled in the art.

Figure 1:
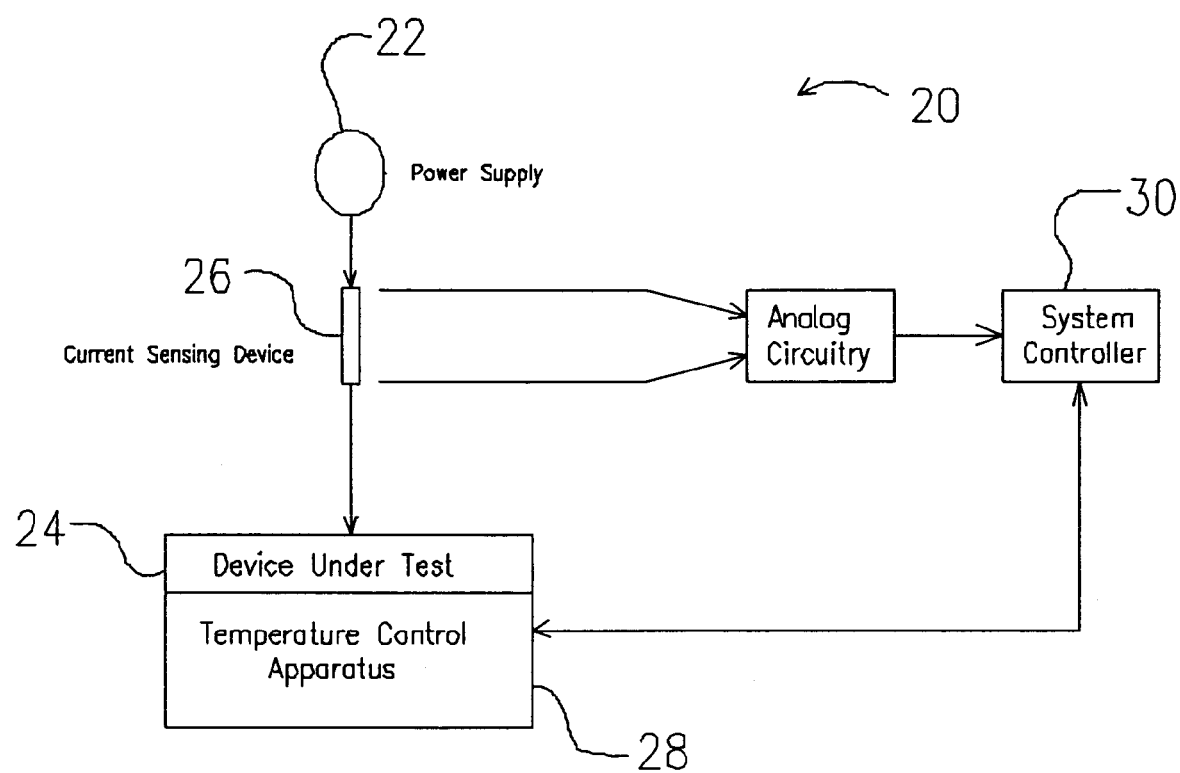
FIG. 1 is a schematic block diagram illustrating an exemplary embodiment of an IC temperature sensing and prediction device according to principles of the invention.

FIG. 1 shows a simple block diagram of an integrated circuit (IC) temperature sensing and prediction device 20 to provide accurate temperature control of the IC according to principles of the invention. Integrated circuits include individual dies and IC packages and the term integrated circuit (IC) used throughout this specification encompasses all forms of integrated circuits. The IC temperature sensing and prediction device 20 can be used during testing which includes burning-in, testing, and programming of the IC or in applications where accurate temperature control of the IC is desired.

A temperature control apparatus 28 is preferably positioned on the device under test (DUT) 24. The temperature controller includes a sensor to sense the surface (or case) temperature of the DUT 24 and a heater or cooler to conduct heat toward or away from the DUT 24. The temperature control apparatus 28 may be similar to that described in commonly-owned U.S. Ser. No. 10/920,531, entitled "Integrated Circuit Temperature Sensing Device and Method," published as US 2005/0189957 A1, incorporated by reference herein.

For more accurate temperature control of the DUT 24, the junction (or die) temperature is preferably measured along with the surface temperature. As is well-known in the art, the junction temperature is a key characteristic in IC operation and long-term reliability. However, the junction temperature cannot be measured directly due to intervening material in the DUT 24, such as an encapsulating case material (i.e., the IC package). The intervening material causes a thermal time delay between the junction temperature and the surface temperature of the DUT 24.

One method to determine the junction temperature of the DUT 24 is based on a simple thermal model (T=Pθ, where T is temperature, P is power dissipation, and θ is the thermal resistance) analogous to Ohm's law (V=IR, where V is voltage, I is current, and R is resistance). The thermal model equates temperature to voltage and power to current. Package thermal resistance is the measure of the package's heat dissipation capability from a die's active surface (the junction) to a specified reference point (the case, board, ambient, etc.). For example, junction-to-case thermal resistance (θjc) measures the ability of the device to dissipate heat from the surface of the die to the top or bottom surface of the package. IC manufacturers typically provide information on thermal resistance for their components. Commercial thermal analysis software packages such as FLOTHERM® are also available to predict device thermal performance.

A power supply 22 provides power to the DUT 24. A current sensing device 26 is preferably coupled between the power supply 22 and the DUT 24 and measures the current passing through the DUT 24. In one embodiment, the current through the DUT 24 can be measured by using a low impedance current sensing resistor 26 (for example, a 0.015 ohm resistor) placed in series with the power supply 22.

A system controller 30 is preferably connected to the temperature control apparatus 28 and to the current sensing device 26. The system controller 30 receives a signal from the temperature control apparatus that indicate the sensed case temperature of the DUT 24. The system controller 30 also receives signals from the current sensing device 26. The current consumed by the DUT 24 is determined by measuring the voltage drop across the current sensing resistor 26. The system controller can then calculate an amount of power consumed by the DUT 24. Power dissipation of the DUT 24 is given by the equation P=IV, where P is the power dissipation, I is the current consumption, and V is the voltage.

Once the amount of power consumed by the DUT 24 is known, the junction temperature can then be predicted and, thus, controlled. Since the case temperature is measured by the temperature control apparatus 28, the system controller 30 can then calculate the junction temperature using the equation:

$$Tj = Tc + P\theta jc, \text{ where}$$

Tj is the junction or die temperature;

Tc is the case or package temperature; and

P is the power dissipated by the device (in watts).

Thus, to determine if the DUT 24 should be heated or cooled to achieve a desired testing temperature, the system controller 30 can more accurately control the temperature of the DUT 24 by using, along with the sensed case temperature from the temperature control apparatus 28, the calculated power consumption to control the junction temperature of the DUT 24. The temperature sensing and prediction device 20 also provides an accelerated temperature feedback loop to the system controller 30 since measuring the voltage drop across the current sensing resistor 26 is not subject to the time delays associated with measuring the case temperature.

Moreover, problems in a given DUT 24 can be readily identified if the sensed case temperature differs greatly from the expected junction temperature for a given level of power consumption. For example, a thermal profile may be predicted for a given device type. If the device is manufactured incorrectly such that its actual thermal profile differs from the expected thermal profile (such as when mispackaging creates a greater thermal resistance between the junction and the case), the case temperature measured may be lower than expected given a certain level of power consumption. Thus, measuring the case temperature and calculating the power consumption of the DUT 24 provides additional information that can identify defective ICs.

Figure 2:
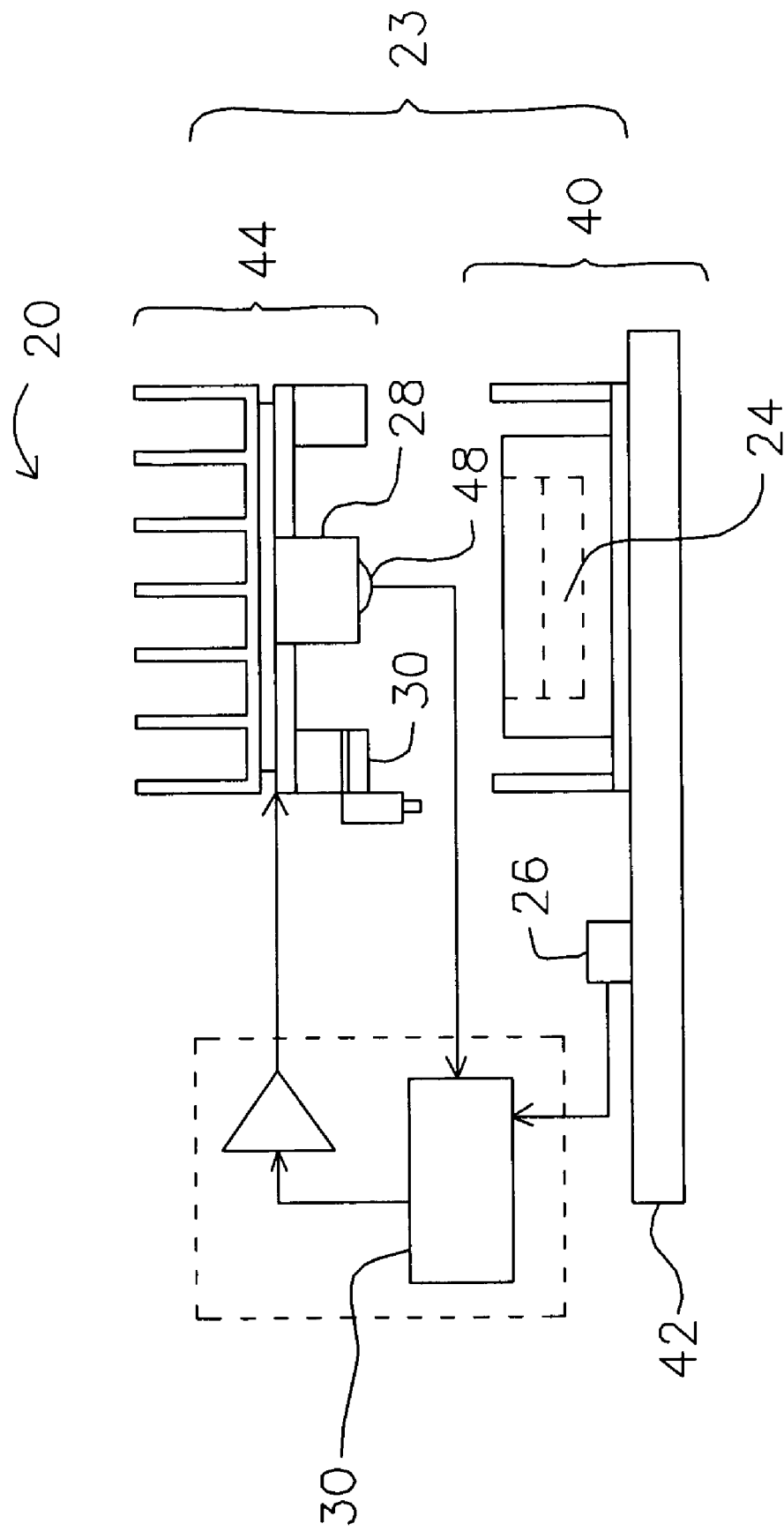
FIG. 2 is a shows a simplified diagram of one embodiment of the IC temperature sensing and prediction device 20 in FIG. 1.

FIG. 2 shows a simplified diagram of one embodiment of the IC temperature sensing and prediction device 20 in FIG. 1. In the embodiment shown, a DUT 24 is placed in an IC testing socket 23 on a testing board 42. The testing socket 23 can be a socket designed to receive an IC for testing which includes, burning-in, testing and programming of the DUT 24. It should be appreciated that IC testing using testing sockets is merely one example in which inventive principles of the invention can be applied. The invention can also be applied to devices that are mounted directly to a printed circuit board (PCB).

The IC testing socket 23 generally comprises a base 40 connected to a testing board 42 and a socket lid 44. The IC testing socket 23 includes a temperature control apparatus 28 for directly controlling the temperature of the IC during testing. A temperature sensor 48 in the temperature control apparatus 28 measures the temperature of the top surface of the DUT 24.

The temperature control apparatus 28 is positioned in the socket lid 44 so that when the IC testing socket 23 is in a closed position, the temperature control apparatus 28 thermally contacts the DUT 24. The temperature control apparatus 28 then effects a change in the temperature of the DUT 24 by conducting heat to or away from the DUT 24. Thus, the temperature control apparatus 28 includes a heater or a cooler.

FIG. 2 also includes a simple circuit diagram showing a system controller 30 in communication with the temperature sensor 48 and the temperature control apparatus 28. The system controller 30 is further connected to a current sensing device 26 which may be located on the board 42. In one embodiment, the system controller 30 may be embedded in the socket lid 44.

Figure 3:
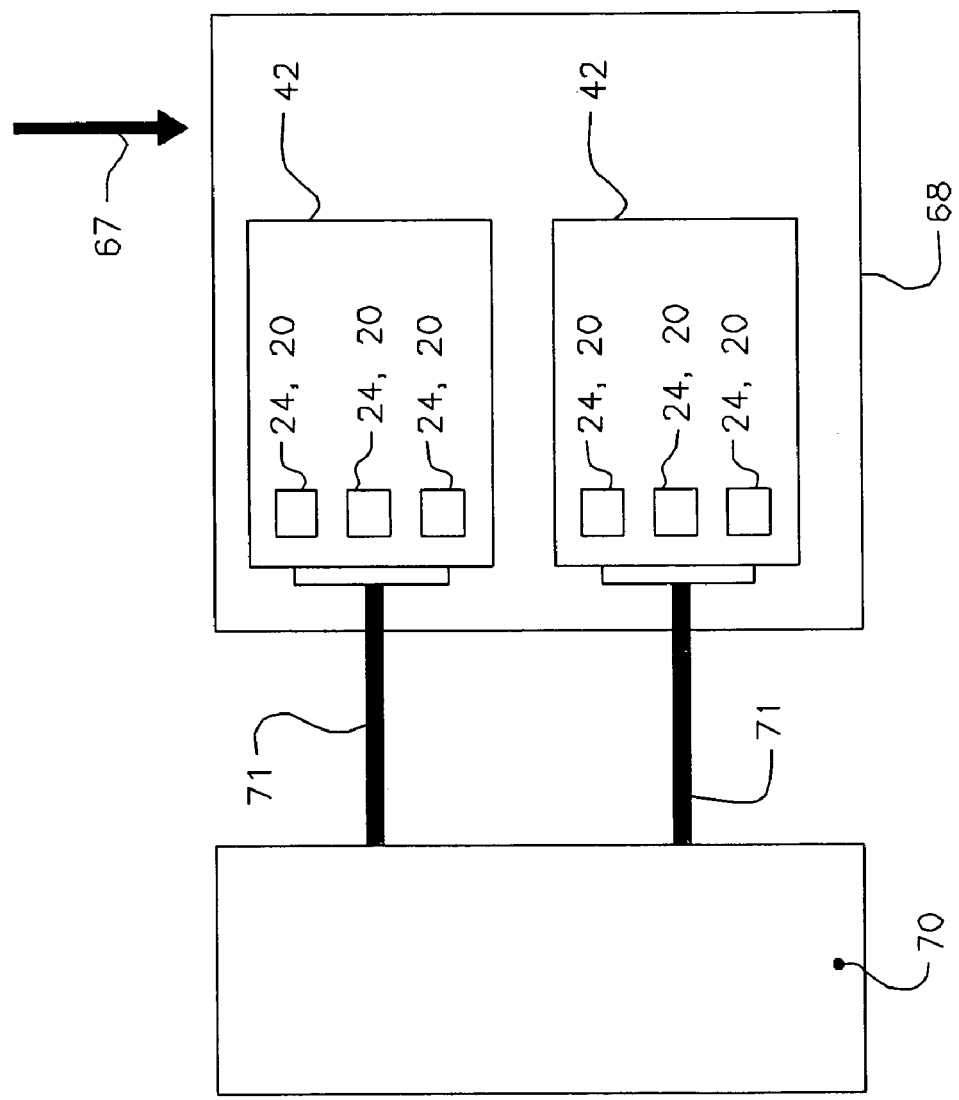
FIG. 3 is a simplified plan view of a system of testing boards within a testing or burn-in chamber according to another embodiment of the invention.

FIG. 3 shows a simplified plan view of a system of testing boards 42 within a testing or burn-in chamber 68 according to another embodiment of the invention. A matrix of DUTs 24 and IC temperature sensing and prediction devices 20 is located on each testing board 42. The testing boards 42 are in communication with an outside power source and driver electronics 70. The power source and driver 70 communicates with the testing boards 42 by means of a data/power bus 71. The power source and driver electronics 70 serves as a system controller which allows a user to determine a desired testing temperature for each DUT 24.

A typical testing chamber 68 is a burn-in chamber where air flow 67 from a fan or some other source is maintained across the testing boards 42. The air flow 67 is preferably maintained at a high enough rate to keep the IC packages below the selected temperature prior to application of heat from the individual heaters 28. The heaters 28 can then more easily maintain an independently selected temperature of each IC package 24. A more detailed description of a system for testing of ICs in which the present invention can be incorporated is shown in commonly-owned U.S. Ser. No. 11/069,589, entitled "Burn-In Testing Apparatus and Method," published as US 2005/0206368 A1, now U.S. Pat. No. 7,042,240.

Reference throughout this specification to "one embodiment" or "an embodiment" means that a particular feature, structure, or characteristic described in connection with the embodiment may be included in at least one embodiment of the invention. Therefore, two or more references to "an embodiment" or "one embodiment" or "an alternative embodiment" are not necessarily all referring to the same embodiment. Furthermore, the particular features, structures or characteristics may be combined or separated as suitable in one or more embodiments of the invention. Although features of the invention are sometimes grouped together in a single embodiment, figure, or description thereof for the purpose of streamlining the disclosure and aiding in the understanding of the various inventive aspects, this method of disclosure is not to be interpreted as reflecting an intention that the claimed invention requires more features than are expressly recited in each claim.

Having described exemplary embodiments of the invention, it should be apparent that modifications and variations can be made by persons skilled in the art in light of the above teachings. Therefore, it is to be understood that changes may be made to embodiments of the invention disclosed that are nevertheless still within the scope and the spirit of the claims.

The invention claimed is:

1. A method for controlling the temperature of an integrated circuit (IC), comprising:
   sensing a surface temperature of the IC;
   measuring an amount of power consumed by the IC;
   predicting a junction temperature of the IC according to a mathematical equation, the mathematical equation expressed as $T_j = T_c + P\theta_{jc}$, wherein $T_j$ is the junction temperature of the IC, $T_c$ is the surface temperature of the IC, P is the amount of power consumed by the IC, and $\theta_{jc}$ is a junction-to-case thermal resistance; and
   adjusting the surface temperature of the IC according to the predicted junction temperature of the IC, wherein adjusting the surface temperature of the IC includes calculating a temperature adjustment value to the measured surface temperature according to the measured power consumption and the thermal profile of the IC.

2. The method of claim 1, wherein sensing the surface temperature of the IC comprises:
   thermally connecting a temperature sensor to the IC.

3. The method of claim 1, wherein the temperature sensor is located in an IC socket lid.

4. The method of claim 1, wherein adjusting the surface temperature of the IC comprises:
   thermally contacting a heater or cooler to the IC.

5. The method of claim 4, wherein the heater or cooler is located in an IC socket lid.

6. The method of claim 4, wherein a temperature sensor is positioned within the heater or cooler such that an insulating material thermally isolates the temperature sensor from the heater or cooler.

7. The method of claim 1, further comprising:
   placing the IC in a test socket;
   thermally connecting the IC to measure the temperature;
   measuring a current of the IC; and
   adjusting a measured IC temperature based on the measured current.

8. A method for controlling the temperature of an integrated circuit (IC), comprising:
   sensing a surface temperature of the IC;
   measuring an amount of power consumed by the IC;
   predicting a junction temperature of the IC according to the amount of power consumption and a thermal profile of the IC; and
   adjusting the surface temperature of the IC according to the predicted junction temperature of the IC;
   comparing the measured surface temperature with the measured power consumption; and
   determining that the IC is defective if the measured surface temperature is not consistent with the measured power consumption according to the thermal profile of the IC.

9. The method of claim 8, wherein sensing the surface temperature of the IC comprises:
   thermally connecting a temperature sensor to the IC.

10. The method of claim 9, wherein the temperature sensor is located in an IC socket lid.

11. The method of claim 8, wherein adjusting the surface temperature of the IC comprises:
    calculating a temperature adjustment value to the measured surface temperature according to the measured power consumption and the thermal profile of the IC.

12. The method of claim 8, wherein adjusting the surface temperature of the IC comprises:
    thermally contacting the heater or cooler to the IC.

13. The method of claim 12, wherein the heater or cooler is located in an IC socket lid.

14. The method of claim 12, wherein a temperature sensor is positioned within the heater or cooler such that an insulating material thermally isolates the temperature sensor from the heater or cooler.

15. The method of claim 8, further comprising:
    placing the IC in a test socket;
    thermally connecting the IC to measure the temperature;
    measuring a current of the IC; and
    adjusting a measured IC temperature based on the measured current.

16. A method for predicting a junction temperature in an integrated circuit (IC), comprising:
    measuring an amount of power consumed by the IC;
    sensing a surface temperature of the IC; and
    determining a temperature adjustment value to the sensed surface temperature according to measured power consumption and a thermal profile of the IC; and
    calculating the junction temperature according to a mathematical equation, the mathematical equation expressed as $T_j = T_c + P\theta_{jc}$, wherein $T_j$ is the junction of the IC, $T_c$ is the surface temperature of the IC, P is the amount of power consumed by the IC, and $\theta_{jc}$ is a junction-to-case thermal resistance.

17. The method of claim 16, wherein calculating the power consumed by the IC comprises:
    coupling a current sensing device to the IC;
    measuring an amount of voltage drop across the current sensing device.

18. A method for independently controlling the temperature of each of a plurality of integrated circuits (ICs), comprising:

sensing a surface temperature of each of the plurality of ICs;

measuring an amount of power consumed by each of the plurality of ICs;

predicting a junction temperature of each of the plurality of ICs according to a mathematical equation, the mathematical equation expressed as $Tj=Tc+P\theta jc$, wherein Tj is the junction temperature of the IC, Tc is the surface temperature of the IC, P is the amount of power consumed by the IC, and $\theta jc$ is a junction-to-case thermal resistance; and adjusting the surface temperature of each of the plurality of ICs according to the predicted junction temperature of each of the plurality of ICs, wherein adjusting a the surface temperature of each of the plurality of ICs includes calculating a temperature adjustment value to the measured surface temperature for each of the plurality of ICs according to the measured power consumption and the thermal profile of each of the plurality of ICs.

19. The method of claim 18, wherein sensing a surface temperature of each of the plurality of ICs comprises:

thermally connecting a corresponding temperature sensor to each of the plurality of ICs.

20. The method of claim 18, wherein each of the plurality of ICs is mounted in one of a plurality of test sockets and a corresponding temperature sensor is located in a corresponding IC socket lid.

21. The method of claim 18, wherein adjusting the surface temperature of each of the plurality of ICs comprises:

thermally contacting a corresponding heater or cooler to each of the plurality of ICs.

22. The method of claim 21, wherein each of the corresponding heater or cooler is located in a corresponding IC socket lid.

23. The method of claim 21, wherein a corresponding temperature sensor is positioned within each of the corresponding heater or cooler such that an insulating material thermally isolates the corresponding temperature sensor from the corresponding heater or cooler.

24. A method for independently controlling the temperature of each of a plurality of integrated circuits (ICs), comprising:

sensing a surface temperature of each of the plurality of ICs;

measuring an amount of power consumed by each of the plurality of ICs;

predicting a junction temperature of each of the plurality of ICs according to the amount of power consumption and a corresponding thermal profile for each of the plurality of ICs; and adjusting the surface temperature of each of the plurality of ICs according to the predicted junction temperature of each of the plurality of ICs;

comparing the measured surface temperature with the measured power consumption for each of the plurality of ICs; and determining that an IC in the plurality of ICs is defective if the measured surface temperature for the IC is not consistent with the measured power consumption according to the thermal profile of the IC.

25. The method of claim 24, wherein sensing a surface temperature of each of the plurality of ICs comprises:

thermally connecting a corresponding temperature sensor to each of the plurality of ICs.

26. The method of claim 24, wherein each of the plurality of ICs is mounted in one of a plurality of test sockets and a corresponding temperature sensor is located in a corresponding IC socket lid.

27. The method of claim 24, wherein adjusting the surface temperature of each of the plurality of ICs comprises:

calculating a temperature adjustment value to the measured surface temperature for each of the plurality of ICs according to the measured power consumption and the thermal profile of each of the plurality of ICs.

28. The method of claim 24, wherein adjusting the surface temperature of each of the plurality of ICs comprises:

thermally contacting a corresponding heater or cooler to each of the plurality of ICs.

29. The method of claim 28, wherein each of the corresponding heater or cooler is located in a corresponding IC socket lid.

30. The method of claim 28, wherein a corresponding temperature sensor is positioned within each of the corresponding heater or cooler such that an insulating material thermally isolates the corresponding temperature sensor from the corresponding heater or cooler.

31. A method for independently controlling the temperature of each of a plurality of integrated circuits (ICs) in a plurality of test sockets, comprising:

placing each of the plurality of ICs in one of the plurality of test sockets, each of the plurality of test sockets containing an IC socket lid, with each IC socket lid containing a corresponding temperature sensor thermally isolated from a corresponding heater or cooler;

thermally connecting each of the plurality of ICs to the corresponding temperature sensor to sense a surface temperature of each of the plurality of ICs;

thermally contacting each of the plurality of ICs to the corresponding heater or cooler;

measuring a current of each of the plurality of ICs; and adjusting the surface temperature for each of the plurality of ICs based on the measured current of each of the plurality of ICs, wherein adjusting the surface temperature of each of the plurality of ICs includes calculating a temperature adjustment value to the measured surface temperature for each of the plurality of ICs according to the measured power consumption and the thermal profile of each of the plurality of ICs.

* * * * *